(12) United States Patent
Kim et al.

(10) Patent No.: US 9,024,362 B2
(45) Date of Patent: May 5, 2015

(54) ORGANIC IMAGE SENSOR WITH OPTICAL BLACK REGIONS

(71) Applicant: Samsung Electronics Co., Ltd., Suwon-si (KR)

(72) Inventors: Sae-Young Kim, Hwaseong-si (KR); Ji-Yong Park, Seoul (KR); Sang-Chul Sul, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 146 days.

(21) Appl. No.: 13/765,121

(22) Filed: Feb. 12, 2013

(65) Prior Publication Data
US 2013/0320309 A1    Dec. 5, 2013

(30) Foreign Application Priority Data

May 31, 2012    (KR) .................. 10-2012-0058068

(51) Int. Cl.
*H01L 27/148* (2006.01)
*H01L 51/44* (2006.01)
*H01L 27/146* (2006.01)

(52) U.S. Cl.
CPC ........ *H01L 51/441* (2013.01); *H01L 27/14603* (2013.01); *H01L 27/14643* (2013.01); *Y02E 10/549* (2013.01)

(58) Field of Classification Search
CPC .............. H01L 2/14643; H01L 27/14603
USPC .................................. 257/186, 225
See application file for complete search history.

(56) References Cited

U.S. PATENT DOCUMENTS

| | | | |
|---|---|---|---|
| 6,303,943 B1 * | 10/2001 | Yu et al. ........................ 257/40 |
| 6,483,541 B1 * | 11/2002 | Yonemoto et al. ............ 348/302 |
| 7,002,231 B2 * | 2/2006 | Rhodes et al. ................ 257/446 |
| 7,119,387 B2 * | 10/2006 | Ohkawa ....................... 257/292 |
| 7,795,656 B2 * | 9/2010 | Moon ........................... 257/294 |
| 7,920,189 B2 | 4/2011 | Goto | |
| 8,729,678 B2 * | 5/2014 | Shim et al. .................... 257/659 |
| 2009/0166783 A1 | 7/2009 | Maruyama | |
| 2010/0060769 A1 | 3/2010 | Inuiya | |
| 2010/0110271 A1 | 5/2010 | Yanagita et al. | |

FOREIGN PATENT DOCUMENTS

| | | |
|---|---|---|
| KR | 1020090072965 A | 7/2009 |
| KR | 1020100048904 A | 5/2010 |

* cited by examiner

*Primary Examiner* — Nicholas Tobergte
(74) *Attorney, Agent, or Firm* — Myers Bigel Sibley & Sajovec, P.A.

(57) ABSTRACT

An organic image sensor includes a first organic photoelectric conversion pixel circuit on an active region of a substrate and a second organic photoelectric conversion pixel circuit on an optical black region of the substrate. The first organic photoelectric conversion pixel circuit includes a first organic photoelectric conversion element configured to generate charges responding to incident light and a first readout circuit configured to receive a first input signal including the charges generated in the first organic photoelectric conversion element. The second organic photoelectric conversion pixel circuit includes a second organic photoelectric conversion element and a second readout circuit configured to receive a second input signal generated irrespective of the incident light.

19 Claims, 7 Drawing Sheets ed States application claims priority

ORGANIC IMAGE SENSOR WITH OPTICAL BLACK REGIONS

CROSS-REFERENCE TO RELATED APPLICATION

This U.S. non-provisional application claims priority under 35 U.S.C. §119 to Korean Patent Application No. 10-2012-0058068, filed on May 31, 2012, in the Korean Intellectual Property Office, the disclosure of which is hereby incorporated by reference in its entirety.

FIELD

The present disclosure generally relates to the field of electronics, and more particular to image sensors.

BACKGROUND

A multi-layer image sensor including a photoelectric conversion element may be used to increase an aperture ratio of an image sensor. The photoelectric conversion element may include a pixel electrode, a photoelectric conversion layer and an opposite electrode, which are stacked on a semiconductor substrate.

The photoelectric conversion layer may include an organic semiconductor layer to reduce charge spreading into adjacent pixel circuits because organic semiconductor layers have relatively high absorption coefficients.

SUMMARY

An organic image sensor may include a semiconductor substrate including an active region and an optical black region. The organic image sensor may further include a first organic photoelectric conversion pixel circuit on the active region configured to measure photo-charges corresponding to incident light and the first organic photoelectric conversion pixel circuit may include a first organic photoelectric conversion element configured to generate charges responding to the incident light. The organic image sensor may also include a second organic photoelectric conversion pixel circuit on the optical black region configured to measure black levels and the second organic photoelectric conversion pixel circuit may include a second organic photoelectric conversion element configured to generate charges irrespective of the incident light.

In various embodiments, the second organic photoelectric conversion element may include a first pixel electrode on the optical black region, a first opposite electrode on the first pixel electrode, a first organic photoelectric conversion layer between the first pixel electrode and the first opposite electrode and a light blocking layer on the first opposite electrode to block the incident light.

According to various embodiments, the light blocking layer may expose the first organic photoelectric conversion element and the first organic photoelectric conversion element may include a second pixel electrode on the active region, a second opposite electrode on the second pixel electrode, and a second organic photoelectric conversion layer between the second pixel electrode and the second opposite electrode.

In various embodiments, the second organic photoelectric conversion element may further include a microlens on the light blocking layer and a color filter between the light blocking layer and the microlens.

According to various embodiments, the optical black region may surround the active region.

An organic image sensor may include a substrate including an active region and an optical black region. The organic image sensor may further include a first organic photoelectric conversion pixel circuit on the active region. The first organic photoelectric conversion pixel circuit on the active region may include a first organic photoelectric conversion element configured to generate charges responding to incident light and a first readout circuit configured to receive a first input signal comprising the charges generated in the first organic photoelectric conversion element. The first organic photoelectric conversion element may be on the first readout circuit. The organic image sensor may also include a second organic photoelectric conversion pixel circuit on the optical black region. The second organic photoelectric conversion pixel circuit may include a second organic photoelectric conversion element and a second readout circuit configured to receive a second input signal generated irrespective of the incident light. The second organic photoelectric conversion element may be on the second readout circuit. Moreover, the organic image sensor may include an insulating layer between the first organic photoelectric conversion element and the first readout circuit and between the second organic photoelectric conversion element and the second readout circuit.

In various embodiments, the first organic photoelectric conversion element may be electrically connected to the first readout circuit and the second organic photoelectric conversion element may be electrically isolated from the second readout circuit.

According to various embodiments, a portion of the insulating layer between the second organic photoelectric conversion element and the second readout circuit electrically may isolate the second organic photoelectric conversion element from the second readout circuit.

In various embodiments, the first organic photoelectric conversion pixel circuit further may include a first via directly contacting the first organic photoelectric conversion element and extending between the first organic photoelectric conversion element and the first readout circuit and a second via directly contacting the second organic photoelectric conversion element and extending between the second organic photoelectric conversion element and the second readout circuit may be absent.

According to various embodiments, the second organic photoelectric conversion pixel circuit may further include a first bias circuit configured to supply a first bias voltage and a portion of the insulating layer between the second organic photoelectric conversion element and the first bias circuit may electrically isolate the second organic photoelectric conversion element from the first bias circuit.

In various embodiments, the first organic photoelectric conversion pixel circuit may further include a second bias circuit configured to supply a second bias voltage and a third via directly contacting the first organic photoelectric conversion element and extending between the first organic photoelectric conversion element and the second bias circuit, and a fourth via directly contacting the second organic photoelectric conversion element and extending between the second organic photoelectric conversion element and the first bias circuit may be absent.

According to various embodiments, the first organic photoelectric conversion element may include a first pixel electrode on the active region, a first opposite electrode on the first pixel electrode and a first organic photoelectric conversion layer between the first pixel electrode and the first opposite electrode. The second organic photoelectric conversion element may include at most two of a second pixel electrode on the optical black region, a second opposite electrode on the second pixel electrode and a second organic photoelectric conversion layer between the second pixel electrode and the second opposite electrode.

In various embodiments, the second opposite electrode may be absent.

According to various embodiments, the second pixel electrode may be absent.

In various embodiments, the second organic photoelectric conversion layer may be absent and the second organic photoelectric conversion element may further include an intervening insulation layer between the second pixel electrode and the second opposite electrode.

An image sensor may include a substrate including an active region and an optical black region. The image sensor may further include a first photoelectric conversion pixel circuit on the active region. The first photoelectric conversion pixel circuit may include a first readout circuit configured to generate a first image signal corresponding to incident light, a first photoelectric conversion element on the first readout circuit and a first connecting circuit between the first readout circuit and the first photoelectric conversion element. The first photoelectric conversion element may further include a first pixel electrode, a first opposite electrode on the first pixel electrode and a first organic photoelectric conversion layer between the first pixel electrode and the first opposite electrode. The first connecting circuit may electrically connect the first photoelectric conversion element and the first readout circuit. The image sensor may also include a second photoelectric conversion pixel circuit on the optical black region. The second photoelectric conversion pixel circuit may include a second readout circuit configured to generate a second image signal corresponding to reduced influence of the incident light on the second photoelectric conversion pixel circuit, a second photoelectric conversion element on the second readout circuit and a second connecting circuit between the second readout circuit and the second photoelectric conversion element. Moreover, the image sensor may include an insulation layer between the first readout circuit and the first photoelectric conversion element and between the second readout circuit and the second photoelectric conversion element.

In various embodiments, the sensor may include a light blocking layer covering the second photoelectric conversion element to block the incident light. The light blocking layer may expose the first photoelectric conversion element.

According to various embodiments, wherein a portion of the insulation layer may be disposed between the second photoelectric conversion element and the second connecting circuit for electrical isolation therebetween.

In various embodiments, the second photoelectric conversion pixel circuit may further include a bias circuit configured to supply a bias voltage and a portion of the insulation layer may be disposed between the second photoelectric conversion element and the bias circuit for electrical isolation therebetween.

According to various embodiments, the second photoelectric conversion element may include at most two of a second pixel electrode, a second opposite electrode on the second pixel electrode and a second organic photoelectric conversion layer between the second pixel electrode and the second opposite electrode.

DETAILED DESCRIPTION OF THE EMBODIMENTS

Figure 1:
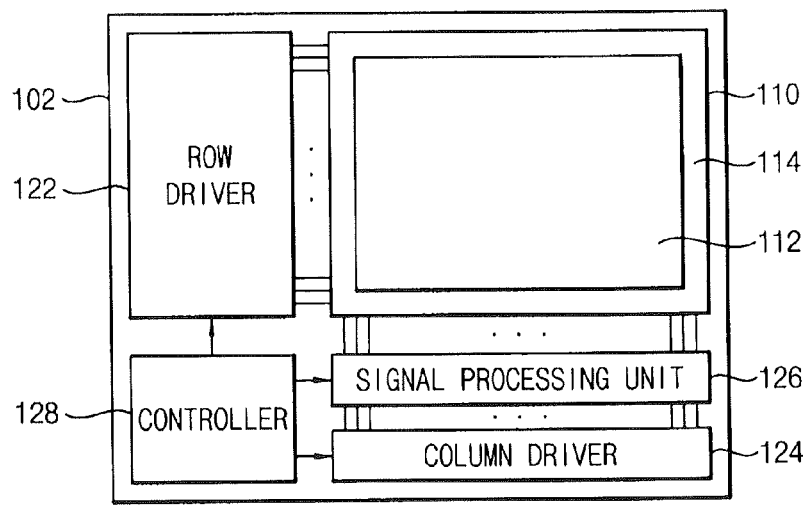
FIG. 1 is a block diagram illustrating an organic image sensor according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

In image sensors or solid-state imaging devices, as the number of the pixel circuits is increased in order to acquire high-resolution images, the pixel circuits are formed in micro-size, and thus the light receiving area of the image sensor is relatively reduced, so that the aperture ratio of the image sensor is also reduced. As the aperture ratio is reduced, the photo-sensitivity of the image sensor is reduced during an imaging process.

A multi-layer image sensor, in which a photoelectric conversion layer laminated on a semiconductor substrate having circuits and wirings thereon, has been proposed to increase the aperture ratio. An organic photoelectric conversion element (e.g., an organic image sensor) including an organic photoelectric conversion layer can promote a relatively great absorption coefficient with a relatively thin photoelectric conversion layer, thereby reducing charges from being spread into adjacent pixel circuits. Accordingly, the optical color mixture and the electric color mixture (e.g., crosstalk) may be reduced.

As appreciated by the present inventors, even in the organic image sensor, some undesirable dark current is caused within a pixel circuit in a state that optical signals are absent, similarly to an image sensor including a silicon photoelectric conversion element. The dark current may be caused by various factors such as thermal energy from the ambient temperature, the internal defects of the pixel circuit, impurities, etc. Therefore, the dark current, which cannot be physically removed from the organic image sensor, should be compensated for by signal processing.

FIG. 1 is a block diagram illustrating an organic image sensor according to some embodiments. Referring to FIG. 1, an organic image sensor 100 may include a pixel array 110 and a peripheral circuit. The peripheral circuit may include a row driver 122, a column driver 124, a signal processing unit 126, and a controller 128.

The pixel array 110 may include an active region 112 and an optical black region 114. The pixel array 110 may include a plurality of organic photoelectric conversion pixel circuits. The organic photoelectric conversion pixel circuits are two-dimensionally arranged on a semiconductor substrate 102, and classified into first and second organic photoelectric conversion pixel circuits.

The first organic photoelectric conversion pixel circuits may be formed in the active region 112 of the semiconductor substrate 102, and may measure photo-charges corresponding to incident light. Each first organic photoelectric conversion pixel circuit may include a first organic photoelectric conversion element that receives the incident light. The second organic photoelectric conversion pixel circuits may be formed in the optical black region 114 of the semiconductor substrate 102, and may measure black levels. Each second organic photoelectric conversion pixel circuit may include a second organic photoelectric conversion element. The first organic photoelectric conversion pixel circuits may be referred to as active pixel circuits, and the second organic photoelectric conversion pixel circuits may be referred to as black pixel circuits. The configuration of the first and second organic photoelectric conversion pixel circuits will be described with reference to FIGS. 2 to 14.

The size of the active region 112 may be determined based on the number of pixel circuits in a horizontal direction and the number of pixel circuits in a vertical direction. The optical black region 114 may be formed at an outer peripheral portion of the active region 112 and may surround the active region 112. For example, the optical black region 114 may be formed at the top, the bottom, the left, and the right of the active region 112. The optical black region 114 may be formed at parts of the top, the bottom, the left, and the right of the active region 112 according to some embodiments.

The row driver 122 may preset shift registers or address decoders. The row driver 122 selectively scans each horizontal line (e.g., row) in response to vertical and horizontal sync signals. The row driver 122 may provide a reset signal, a transfer signal, and a select signal to a reset line, a transfer line, and a select line provided for each horizontal line, respectively.

The column driver 124 may preset shift registers or address decoders. The column driver 124 selectively scans circuit parts of the signal processing unit 126, which correspond to each vertical line (e.g., column), in sequence. As the column driver 124 performs the selective scanning operation, pixel signals subject to a signal processing operation with respect to each column in the signal processing unit 126 are sequentially output.

The signal processing unit 126 may perform a preset signal processing operation for an analogue pixel signal, which is output from each pixel circuit of a selected row, with respect to each column of the pixel array 110. For instance, the signal processing operation of the signal processing unit 126 may include a correlated double sampling (CDS) operation. The CDS operation is to remove fixed-pattern noise of a pixel circuit while obtaining a pixel signal corresponding to one row by receiving reset and signal levels, which are output from each pixel circuit of the selected row, and calculating the difference between the reset and signal levels. In addition, the signal processing unit 126 may have an analog-to-digital (AD) conversion function to digitalize the analog pixel signal. The signal processing unit 126 may include a function of removing noise and an AD conversion function.

The controller 128 may receive a clock supplied from the outside of the semiconductor substrate 102 or data used to order an operating mode. In addition, the controller 128 may pick up image data in the organic image sensor 100. The controller 128 preset a timing generator to generate various timing signals, and controls the driving of the row driver 122, the column driver 124, and the signal processing unit 126 based on the various timing signals generated from the timing generator.

In addition, the controller 128 may perform an auto dark level compensation (ADLC) algorithm. In general, each pixel circuit may generate optical current by the photoelectric conversion only if light is incident into the pixel circuit. However, even if the light is not incident into the pixel circuit, current may flow due to various causes such as thermal noise and insulation failure. Such current is referred to as dark current. The dark current is one of serious causes to degrade the performance of the organic image sensor 100. Therefore, the controller 128 may find the output signal, which is generated based on photo-charges purely resulting from the photoelectric conversion in the active region 112, by subtracting an output signal of the optical black region 114 from an output signal of the active region 112. Such process is referred to as the ADLC. The ADLC may include a scheme of processing digital signals in software inside the controller 128 and a scheme of processing signals in hardware inside the signal processing module 126.

Figure 2:
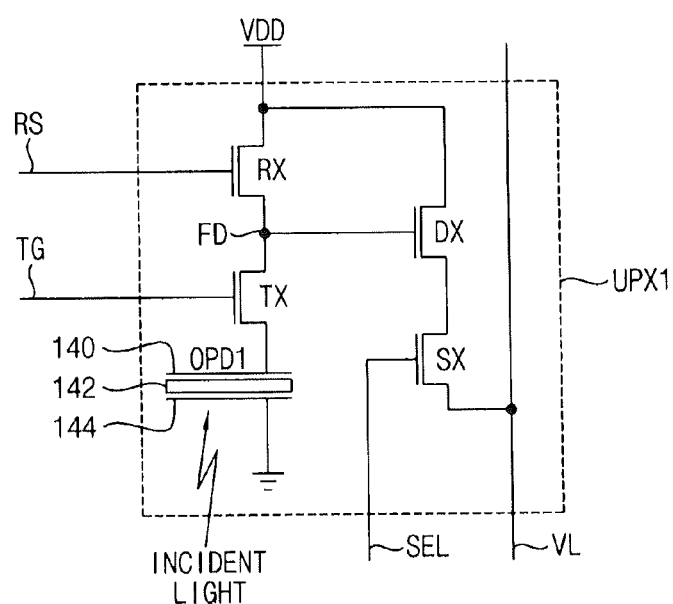
FIG. 2 is a circuit diagram illustrating an organic photoelectric conversion pixel circuit in an active region of an organic image sensor according to some embodiments.
Figure 3:
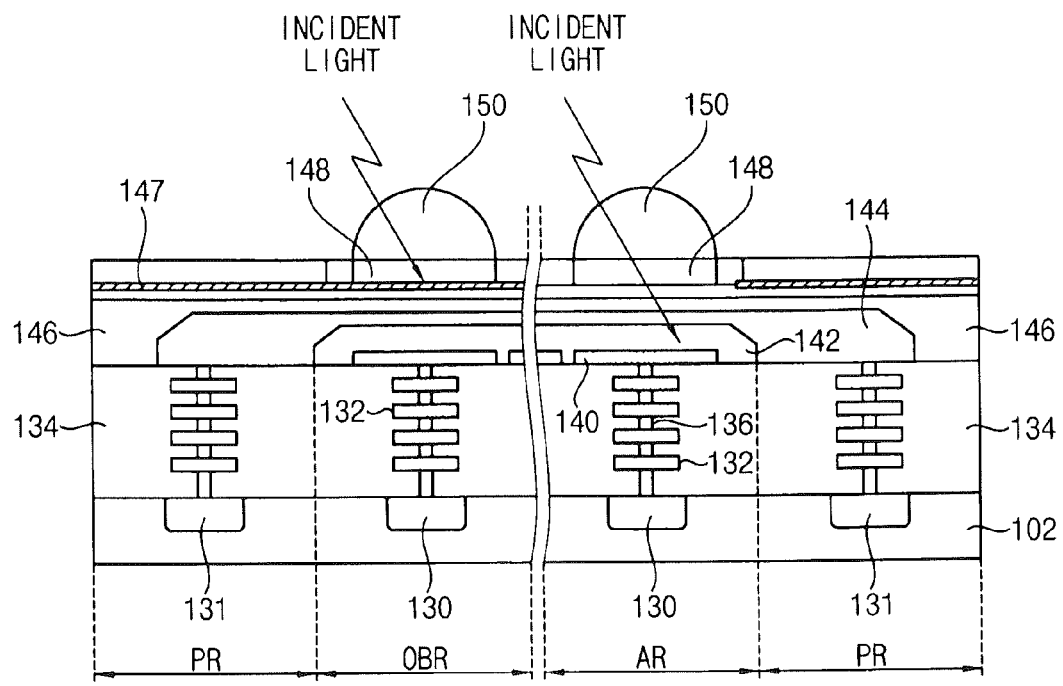
FIG. 3 is a sectional view illustrating an organic image sensor according to some embodiments.
Figure 4:
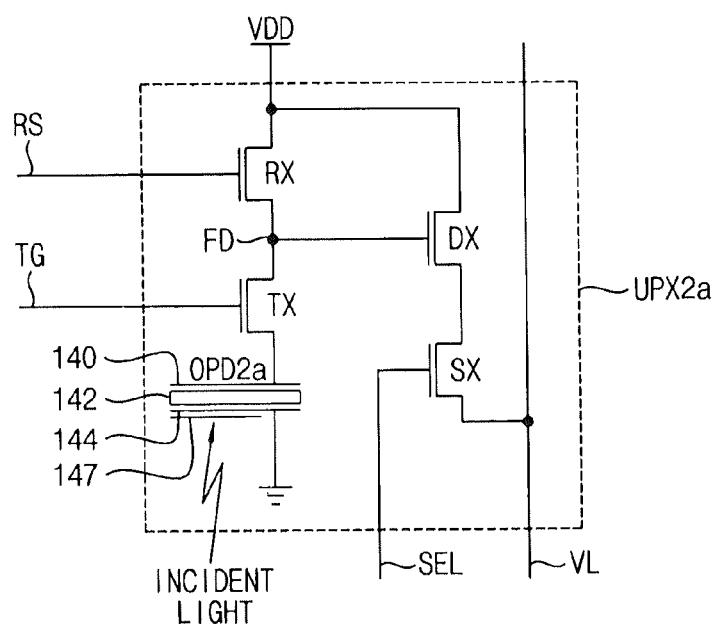
FIG. 4 is a circuit diagram illustrating the organic photoelectric conversion pixel circuit in the optical black region of the organic image sensor of FIG. 3.

FIG. 2 is a circuit diagram illustrating an organic photoelectric conversion pixel circuit included in the active region of the organic image sensor according to some embodiments. FIG. 3 is a sectional view illustrating an organic image sensor according to some embodiments. FIG. 4 is a circuit diagram illustrating the organic photoelectric conversion pixel circuit in the optical black region of the organic image sensor of FIG. 3.

Referring to FIGS. 2 through 4, the organic image sensor according to some embodiments may include the first organic photoelectric conversion pixel circuit UPX1 in the active region AR and the second organic photoelectric conversion pixel circuit UPX2a in the optical black region OBR. The organic image sensor may further include a readout circuit 130 and a bias voltage supply circuit 131.

The readout circuit 130 may be formed in the active region AR and the optical black region OBR on the semiconductor substrate 102 corresponding to the first and second organic photoelectric conversion pixel circuits UPX1 and UPX2a. The readout circuit 130 may include at least one transistor, and may generate an image signal corresponding to the incident light. The bias voltage supply circuit 131 may be formed in the peripheral region PR on the semiconductor substrate 102 to supply a bias voltage to each organic photoelectric conversion pixel circuit.

Hereinafter, the circuit structure for the first organic photoelectric conversion pixel circuits UPX1 and the driving method thereof will be described. As illustrated in FIG. 2, the first organic photoelectric conversion pixel circuit UPX1 may include a first organic photoelectric conversion element OPD1, a transfer transistor TX, a reset transistor RX, a floating diffusion region FD, a drive transistor DX, and a select transistor SX. The transistors TX, RX, DX, and SX may be included in the readout circuit 130. The transistors TX, RX, DX, and SX may be NMOS transistors. The combination of the conductive types of the transistors is only provided for the illustrative purpose, and the embodiments are not limited thereto.

The transfer transistor TX transfers photo-charges and thermal charges, which are generated by the first organic photoelectric conversion element OPD1, to the floating diffusion region FD. The reset transistor RX periodically resets charges, holes or electrons, stored in the floating diffusion region FD to the level of a power supply voltage VDD. The drive transistor DX operates as a source follower buffer amplifier to perform a buffering operation for a signal according to the charges stored in the floating diffusion region FD. The select transistor SX performs switching and addressing operations to select a unit pixel circuit in response to the select signal SEL, so that the signal according to the stored charges is transferred to an output terminal.

The first organic photoelectric conversion pixel circuit UPX1 of FIG. 2 may generate an output signal based on the charge of photo-charges resulting from the photoelectric conversion and the charge of thermal electrons generated in the pixel circuit. FIG. 2 shows the circuit structure of the organic photoelectric conversion pixel circuit including one organic photoelectric conversion element OPD1 and four transistors TX, RX, DX, and SX. However, the organic photoelectric conversion pixel circuit included in the organic image sensor according to some embodiments is not limited thereto. The organic photoelectric conversion pixel circuit may be substituted with a predetermined organic photoelectric conversion pixel circuit including at least three transistors including a transfer transistor TX and a drive transistor DX and an organic photoelectric conversion element.

The first organic photoelectric conversion pixel circuit UPX1 may include a transfer line TG, a reset line RS, and a select line SEL as pixel driving lines. Each of the pixel driving lines may be connected to output terminals corresponding to each row of the row driver 122.

The first organic photoelectric conversion element OPD1 may include a cathode electrode (e.g., pixel electrode 140), an organic photoelectric conversion layer 142, and an anode electrode (e.g., opposite electrode 144). The opposite electrode 144 may be connected to the terminal of bias voltage (e.g., ground voltage). The organic photoelectric conversion layer 142 photoelectrically converts the received light into photo-charges having the quantity of electric charge corresponding to the quantity of the received light. The pixel electrode 140 may be electrically connected to a gate electrode of the drive transistor DX through the transfer transistor TX.

The transfer transistor TX may be between the pixel electrode 140 of the first organic photoelectric conversion element OPD1 and the floating diffusion node FD. A transfer pulse, which represents an active state at a high level thereof (e.g., VDD level), is applied to a gate electrode of the transfer transistor TX through the transfer line TG. The transfer transistor TX becomes turned on based on the transfer pulse to transfer the photo-charges, which have been obtained through the photoelectric conversion in the first organic photoelectric conversion element OPD1, to the floating diffusion node FD.

The reset transistor RX has a drain electrode connected to the terminal of the power supply voltage VDD and a source electrode connected to the floating diffusion electrode FD. A reset pulse, which represents an active state at a high level thereof, is applied to a gate electrode of the reset transistor RX through the reset line RS. Accordingly, the reset transistor RX becomes turned on based on the reset pulse to reset the floating diffusion node FD by discharging charges in the floating diffusion node FD using the power supply voltage VDD before signal charges are transferred from the first organic photoelectric conversion element OPD1 to the floating diffusion node FD.

The drive transistor DX may have the gate electrode connected to the floating diffusion node FD and a drain electrode connected to the terminal of the power supply voltage VDD. In addition, the drive transistor DX outputs the potential of the floating diffusion node FD, which is obtained after the floating diffusion node FD has been reset by the reset transistor RX, as a reset signal (reset level) Vrst. The drive transistor DX outputs the potential of the floating diffusion node FD, which is obtained after the signal charges have been transferred to the floating diffusion node FD by the transfer transistor TX, as an optical charge signal (signal level) Vsgn.

The select transistor SX may have a drain electrode connected to a source electrode of the drive transistor DX and a source electrode connected to a vertical signal line VL. A select pulse, which represents an active state at a high level thereof, is applied to a gate electrode of the select transistor SX through the select line SEL. The select transistor SX becomes turned on based on the select pulse to provide the signal output from the drive transistor DX to the vertical signal line VL.

Hereinafter, a process of fabricating the first organic photoelectric conversion pixel circuit UPX1 will be described. The transistors TX, RX, DX, and SX included in the readout circuit 130 corresponding to the first organic photoelectric conversion pixel circuits UPX1 may be formed in the active region AR of the semiconductor substrate 102. In addition, the bias voltage supply circuit 131 may be formed in the peripheral region PR of the semiconductor substrate 102. The components of the readout circuit 130 and the bias voltage supply circuit 131 may be connected to each other through multi-layer metal electrode layers 132 to form the readout circuit 130 and the bias voltage supply circuit 131. The multi-layer metal electrode layers 132 may be covered with an insulation layer 134, and the first organic photoelectric conversion element OPD1 is formed on the insulation layer 134. The organic image sensor according to some embodiments may be provided by forming the circuits 130 and 131 for transferring electrical signals on the semiconductor substrate 102 and then forming the first organic photoelectric conversion element OPD1 on the circuits 130 and 131.

The first organic photoelectric conversion element OPD1 may include a pixel electrode 140, an organic photoelectric conversion layer 142, an opposite electrode 144 provided in opposition to the pixel electrode 140, and a protection layer 146. The pixel electrode 140 may be electrically connected to the readout circuit 130, which is provided under the pixel electrode 140, through a via contact 136. The opposite electrode 144 may extend to the peripheral region PR, so that the opposite electrode 144 may be connected to the ground through the bias voltage supply circuit 131. Accordingly, the opposite electrode 144 may be biased with the ground voltage.

The pixel electrode 140 may be formed by depositing titanium nitride at a predetermined thickness by a CVD scheme to form a thin film. The titanium nitride may be etched under the isotropic plasma etching condition and patterned according to unit pixel regions. The organic photoelectric conversion layer 142 may be formed by depositing an N-type organic semiconductor at a predetermined thickness on the pixel electrode 140.

The opposite electrode 144 may be formed on the organic photoelectric conversion layer 142 by an RF magnetron sputtering scheme using indium-tin oxide (ITO) under a vacuum condition into which argon (Ar) gas and oxygen ($O_2$) gas may be injected.

The protection layer 146 may include an aluminum oxide ($Al_2O_3$) formed at the vacuum condition by using trimethylaluminum and water, and using argon (Ar) gas as carrier gas in an atomic layer deposition device.

A color filter 148 and a micro-lens 150 may be formed on the protection layer 146.

Referring to FIG. 4, a second organic photoelectric conversion element OPD2a included in the second organic photoelectric conversion pixel circuit UPX2a may include the pixel electrode 140, the organic photoelectric conversion layer 142, the opposite electrode 144, the protection layer 146 and the light blocking layer 147. The light blocking layer 147 may be formed on the protection layer 146, while exposing the active region AR, to block incident light into the organic photoelectric conversion layer 142 in the optical black region OBR. Accordingly, light may incident into the organic photoelectric conversion layer 142 of the active pixel circuit so that the light is converted into photo-charges according to the quantity of the incident light. However, since the incident light is blocked by the light blocking layer 147 in the second organic photoelectric conversion pixel circuit UPX2a, an output signal of the second organic photoelectric conversion element OPD2a may be irrespective of the incident light. The output signal of the second organic photoelectric conversion element OPD2a may include thermal charges and charges generated in the black pixel circuit corresponding to reduced influence of the incident light.

The organic image sensor illustrated in FIG. 3, the organic photoelectric conversion element OPD2a in the optical black region OBR may include the light blocking layer 147 on the opposite electrode 144. When fabricating the organic image sensor, after forming a plurality of transistors in the readout circuit 130 on the semiconductor substrate 102 for generating an image signal, the transistors in the readout circuit 130 may be covered with the insulation layer 134. A connecting circuit including the multi-layer metal electrode layers 132 and the via contact 136 may be formed in the insulation layer 134 to connect the organic photoelectric conversion element OPD2a to the transistors in the corresponding readout circuit 130. Then, a plurality of pixel electrodes 140 may be formed on the insulation layer 134 and then covered by an organic photoelectric conversion layer 142. After covering the organic photoelectric conversion layer 142 with the opposite electrode 144, the light blocking layer 147 may be partially formed on the opposite electrode 144 in the optical black region OBR to block incident light into organic photoelectric conversion elements in the optical black region OBR.

Figure 5:
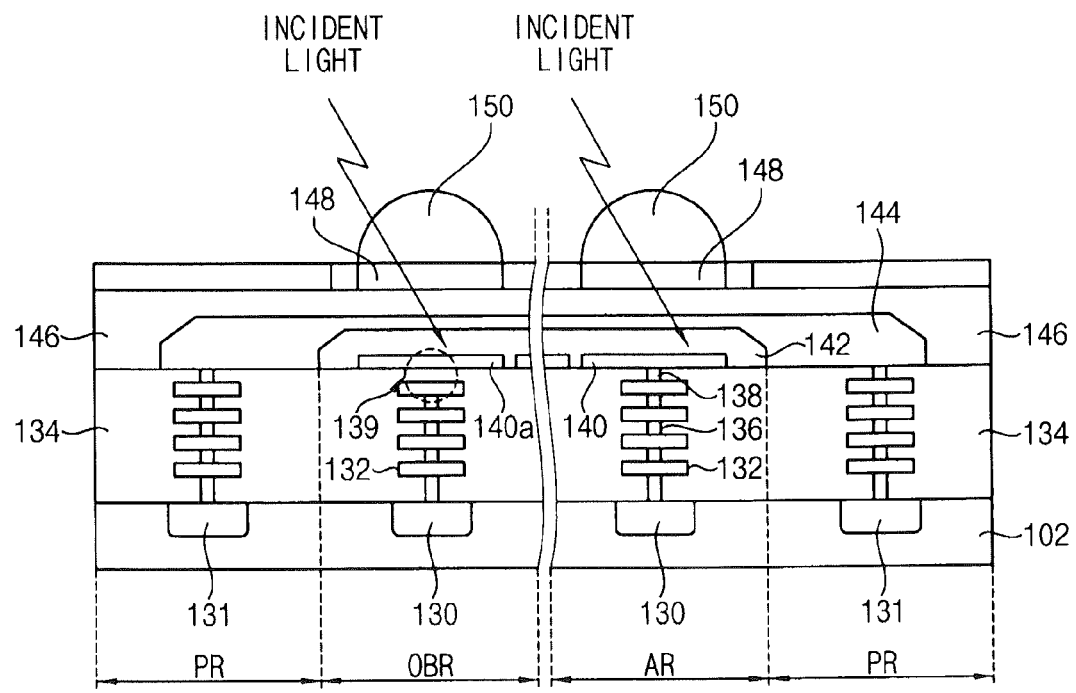
FIG. 5 is a sectional view illustrating an organic image sensor according to some embodiments.
Figure 6:
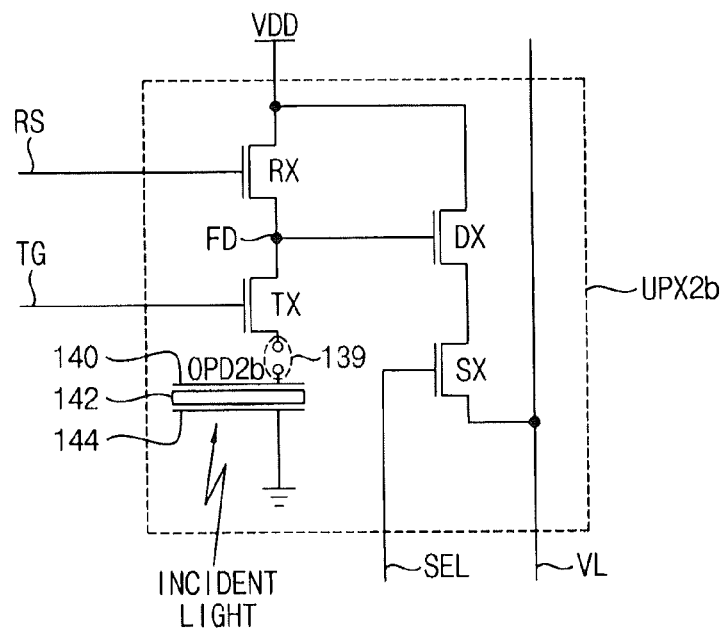
FIG. 6 is a circuit diagram illustrating the organic photoelectric conversion pixel circuit in the optical black region of the organic image sensor of FIG. 5.

FIG. 5 is a sectional view illustrating an organic image sensor according to some embodiments and FIG. 6 is a circuit diagram illustrating the organic photoelectric conversion pixel circuit in the optical black region of the organic image sensor of FIG. 5.

Referring to FIGS. 5 and 6, the pixel electrode 140 of the organic photoelectric conversion element OPD1 in the active region AR is electrically connected with transistors in the corresponding readout circuit 130 for generating an image signal. However, the organic photoelectric conversion elements OPD2b in the organic photoelectric conversion pixel circuit UPX2b, a black pixel circuit, in the optical black region OBR is electrically isolated from the corresponding readout circuit 130.

The pixel electrode 140 in the optical black region OBR may be electrically isolated from the transfer transistor TX in the readout circuit 130 because the via contact contacting the pixel electrode 140a in the optical black region OBR is absent. Accordingly, even if light is incident into the organic photoelectric conversion layer 142 of the black pixel circuit, the photo-charges may not be transferred to the floating diffusion node FD and only charges generated from the readout circuit 130 are transferred to the vertical line VL. Therefore, the readout circuit 130 corresponding to the organic photoelectric conversion elements OPD2b may receive an input signal generated responding to reduced influence of the incident light.

According to the process of fabricating the image sensor, when the via contact 138 contacting the pixel electrode 140 in the active region AR is formed in the insulation layer 134, the via contact contacting the pixel electrode 140a in the optical black region OBR may not be formed. A portion of the insulation layer 134 may electrically isolate the organic photoelectric conversion element OPD2b from the corresponding readout circuit 130 as shown in 139. After forming the via contact 138 in the active region AR, a plurality of pixel electrodes 140 may be formed on the insulation layer 134. The plurality of pixel electrodes 140 may be covered with organic photoelectric conversion layers 142. The organic photoelectric conversion layers 142 may be covered with the opposite electrodes 144.

Figure 7:
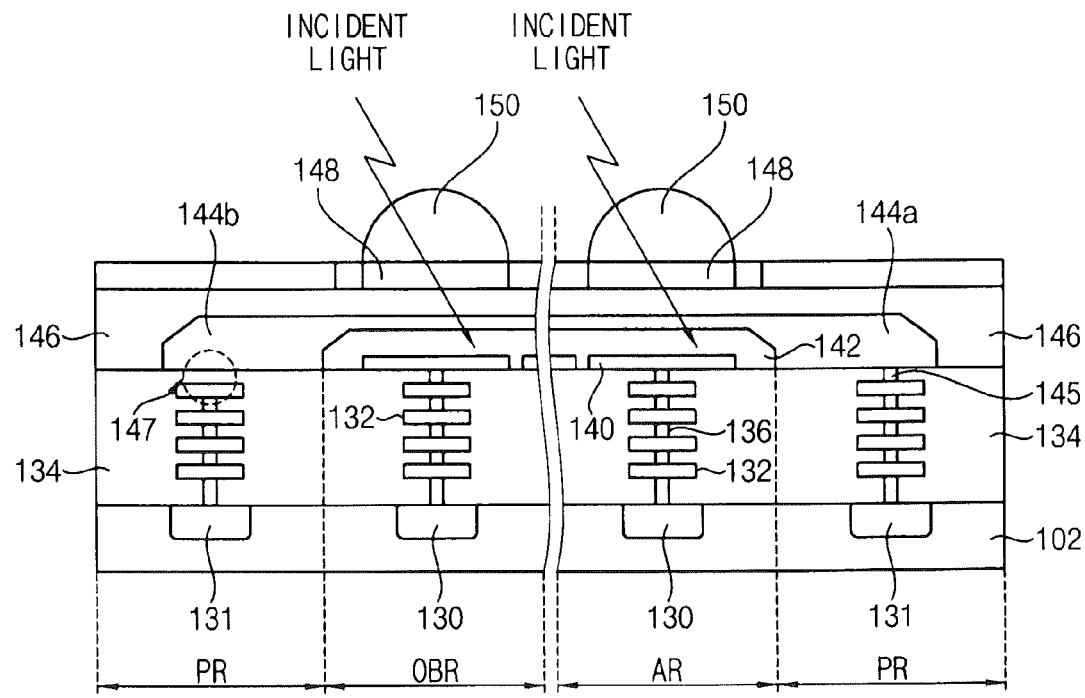
FIG. 7 is a sectional view illustrating an organic image sensor according to some embodiments.
Figure 8:
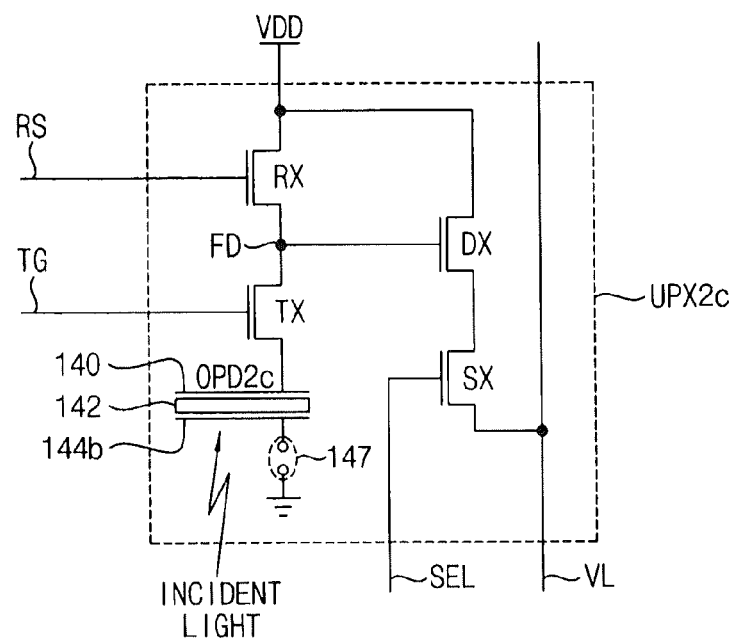
FIG. 8 is a circuit diagram illustrating the organic photoelectric conversion pixel circuit in the optical black region of the organic image sensor of FIG. 7.

FIG. 7 is a sectional view illustrating an organic image sensor according to some embodiments. FIG. 8 is a circuit diagram illustrating the organic photoelectric conversion pixel circuit in the optical black region of the organic image sensor of FIG. 7.

Referring to FIGS. 7 and 8, the organic photoelectric conversion pixel circuit UPX2c, a black pixel circuit, in the optical black region OBR may include the bias voltage supply circuit 131, which is electrically isolated from the opposite electrode 144b of the organic photoelectric conversion element OPD2c. According to the process of fabricating the image sensor, when the via contact 145 contacting the opposite electrode 144a of the active pixel circuit is formed in the insulation layer 134, the via contact contacting the opposite electrode 144b of the black pixel circuit may not be formed. A portion of the insulation layer 134 may electrically isolate the opposite electrode 144b from the bias voltage supply circuit 131 as shown in 147. After forming the via contact 145 contacting the opposite electrode 144a, a plurality of pixel electrodes 140 are formed on the insulation layer 134. The plurality of pixel electrodes 140 are covered with organic photoelectric conversion layers 142. The organic photoelectric conversion layers 142 are covered with opposite electrodes 144a and 144b.

The image sensor illustrated in FIG. 7, a bias voltage may be applied between the pixel electrode 140 and the opposite electrode 144a of the organic photoelectric conversion elements OPD1 formed in the active region AR but a bias voltage may not be applied between the pixel electrode 140 and the opposite electrode 144b of organic photoelectric conversion element OPD2c formed in the optical black region OBR because the opposite electrode 144b of the optical black region OBR is not connected to the bias voltage supply circuit 131.

Therefore, even if light is incident into the organic photoelectric conversion layer 142 of the black pixel circuit so that the photo-electrons are generated, since the via contact contacting the opposite electrode 144b is absent, the bias voltage is not applied to both terminals of the organic photoelectric conversion layer 142. Accordingly, the photo-charges generated in the organic photoelectric conversion layer 142 are not collected in the pixel electrode 140.

Figure 9:
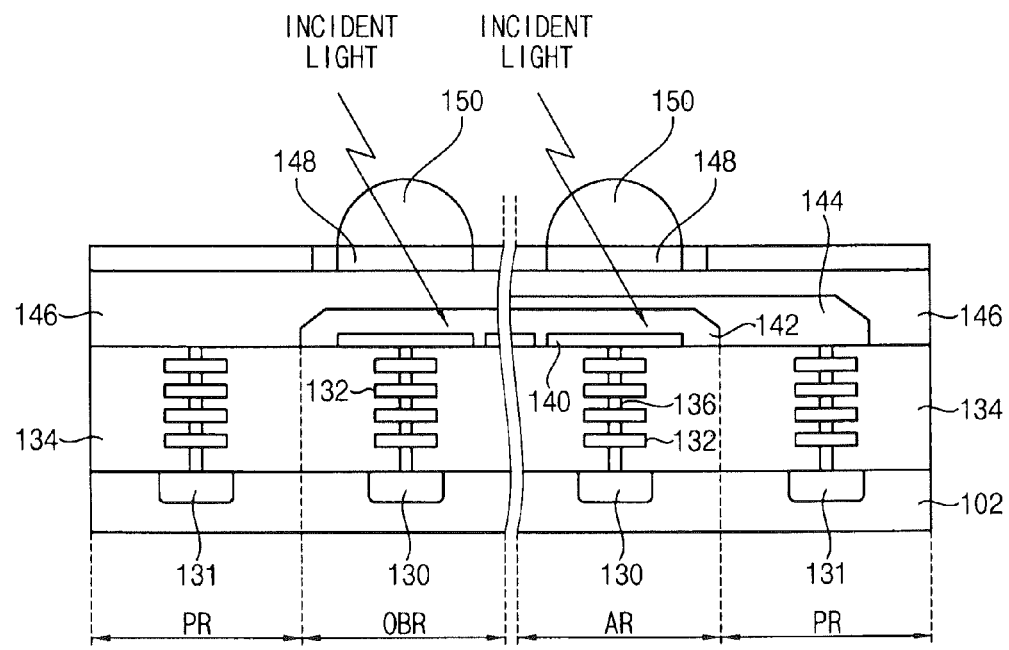
FIG. 9 is a sectional view illustrating an organic image sensor according to some embodiments.
Figure 10:
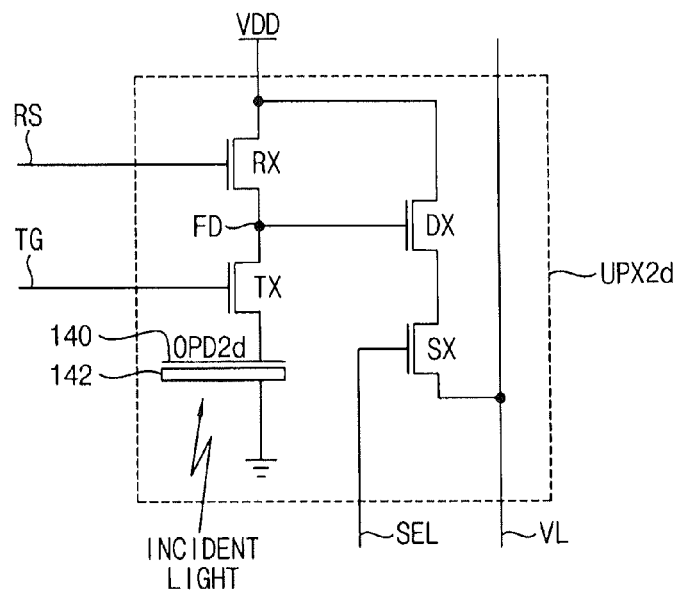
FIG. 10 is a circuit diagram illustrating the organic photoelectric conversion pixel circuit in the optical black region of the organic image sensor of FIG. 9.

FIG. 9 is a sectional view illustrating an organic image sensor according to some embodiments. FIG. 10 is a circuit diagram illustrating the organic photoelectric conversion pixel circuit in the optical black region of the organic image sensor of FIG. 9.

Referring to FIGS. 9 and 10, each organic photoelectric conversion element in the active region AR may have a stacked structure including a pixel electrode 140, an organic photoelectric conversion layer 142 and an opposite electrode 144. However, an organic photoelectric conversion element OPD2d of an organic photoelectric conversion pixel circuit UPX2d, a black pixel circuit, in the optical black region OBR may not include the opposite electrode 144. Therefore, the bias voltage may not be applied to both terminals of the organic photoelectric conversion layer 142 of the black pixel circuit because the opposite electrode 144 in the optical black region OBR is absent.

Accordingly, even if light is incident into the organic photoelectric conversion layer 142 of the black pixel circuit so that photo-charges are generated, the photo-charges may not be collected in the pixel electrode 140 in the optical black region OBR. Therefore, the readout circuit 130 of the organic photoelectric conversion pixel circuit UPX2d may receive an input signal generated responding to reduced influence of the incident light.

To form the organic photoelectric conversion pixel circuit of FIGS. 9 and 10, the opposite electrode 144 may be removed from the optical black region OBR when the opposite electrode 144 in the active region AR is patterned. After a plurality of transistors in the readout circuit 130 for generating image signals are formed on the semiconductor substrate, an insulation layer 134 may cover the plurality of transistors. To connect a plurality of organic photoelectric conversion elements with a plurality of corresponding transistors, connecting circuits including the multi-layer metal electrode layers 132 and the via contacts 136 may be formed in the insulation layer 134. A plurality of pixel electrodes 140 may be formed on the insulation layer 134 corresponding to the plurality of organic photoelectric conversion elements. The plurality of pixel electrodes 140 may be covered with the organic photoelectric conversion layers 142. The opposite electrodes 144 may be formed on the organic photoelectric conversion layers 142.

Figure 11:
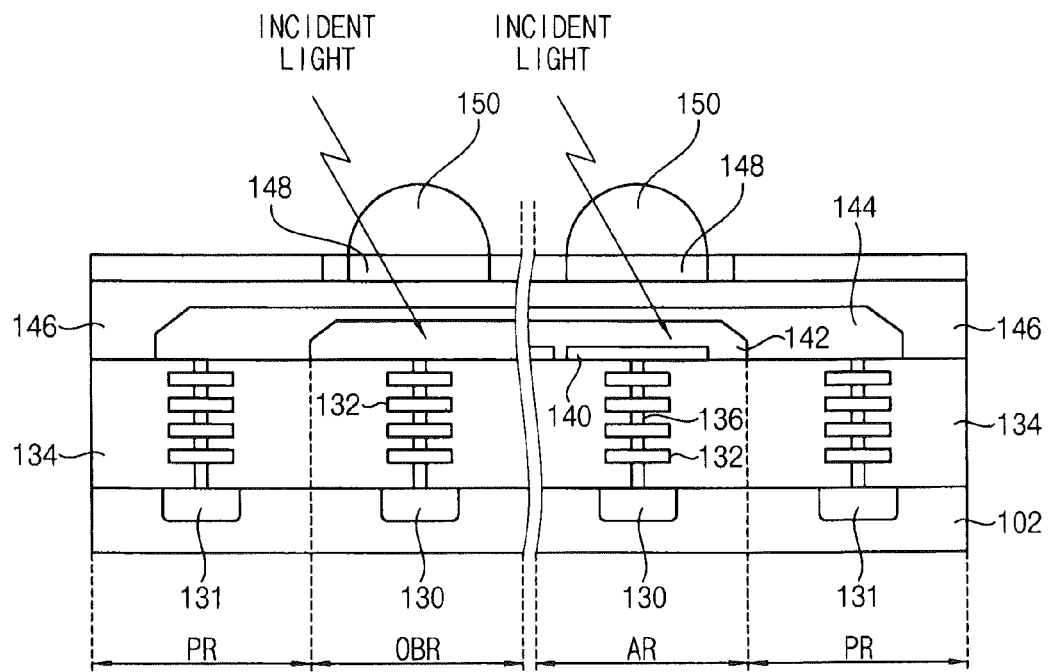
FIG. 11 is a sectional view illustrating an organic image sensor according to some embodiments.
Figure 12:
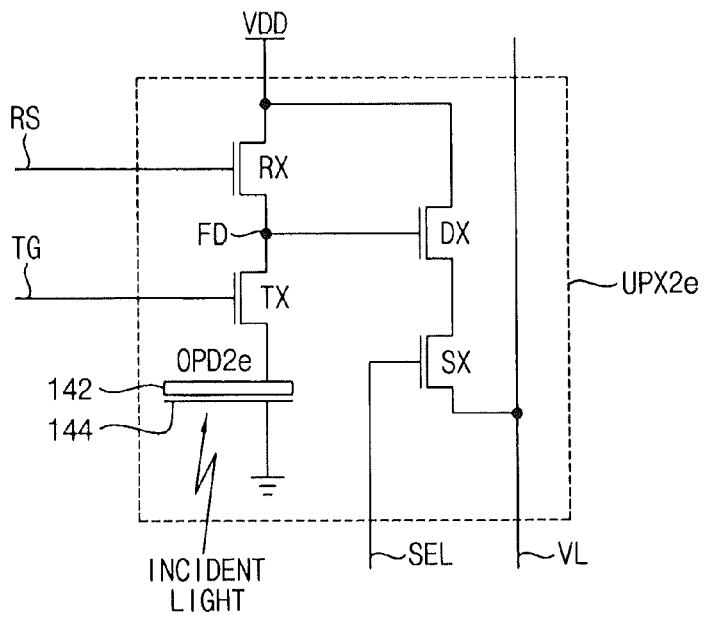
FIG. 12 is a circuit diagram illustrating the organic photoelectric conversion pixel circuit in the optical black region of the organic image sensor of FIG. 11.

FIG. 11 is a sectional view illustrating an organic image sensor according to some embodiments. FIG. 12 is a circuit diagram illustrating the organic photoelectric conversion pixel circuit in the optical black region of the organic image sensor of FIG. 11.

Referring to FIGS. 11 and 12, each organic photoelectric conversion element in the active region AR may have a stacked structure including a pixel electrode 140, an organic photoelectric conversion layer 142 and an opposite electrode 144. However, an organic photoelectric conversion element OPD2e of an organic photoelectric conversion pixel circuit UPX2e, a black pixel circuit, in the optical black region OBR may not include the pixel electrode 140. Therefore, the bias voltage may not be applied to both terminals of the organic photoelectric conversion layer 142 because the pixel electrode 140 in the optical black region OBR is absent.

Accordingly, even if light is incident into the organic photoelectric conversion layer 142 of the black pixel circuit so that photo-charges are generated in the organic photoelectric conversion layer 142, photo-charges may not be transferred to the transfer transistor TX.

To form the organic photoelectric conversion pixel circuit of FIGS. 11 and 12, the pixel electrode 140 may be removed from the optical black region OBR when the pixel electrode 140 in the active region AR is formed. After a plurality of transistors in the readout circuit 130 for generating image signals are formed on the semiconductor substrate, an insulation layer 134 may cover the plurality of transistors. To connect a plurality of organic photoelectric conversion elements with a plurality of corresponding transistors, connecting circuits including the multi-layer metal electrode layers 132 and the via contacts 136 may be formed in the insulation layer 134. A plurality of pixel electrodes 140 may be formed only in the active region AR on the insulation layer 134 corresponding to the plurality of organic photoelectric conversion elements. The plurality of pixel electrodes 140 may be covered with the organic photoelectric conversion layers 142. The opposite electrodes 144 may be formed on the organic photoelectric conversion layers 142.

Figure 13:
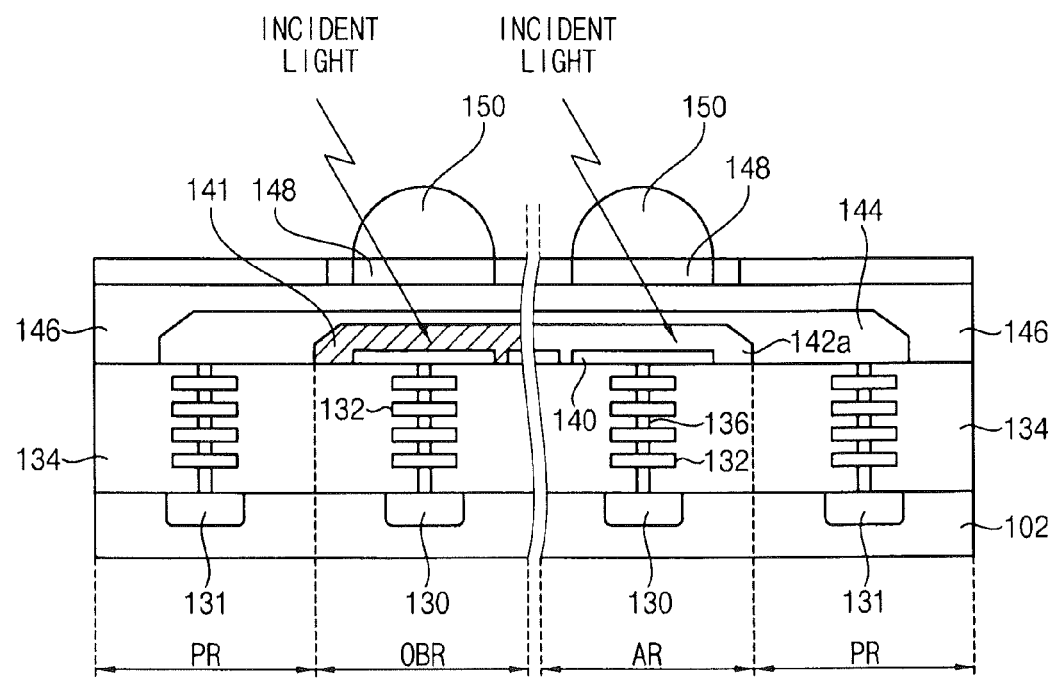
FIG. 13 a sectional view illustrating an organic image sensor according to some embodiments.
Figure 14:
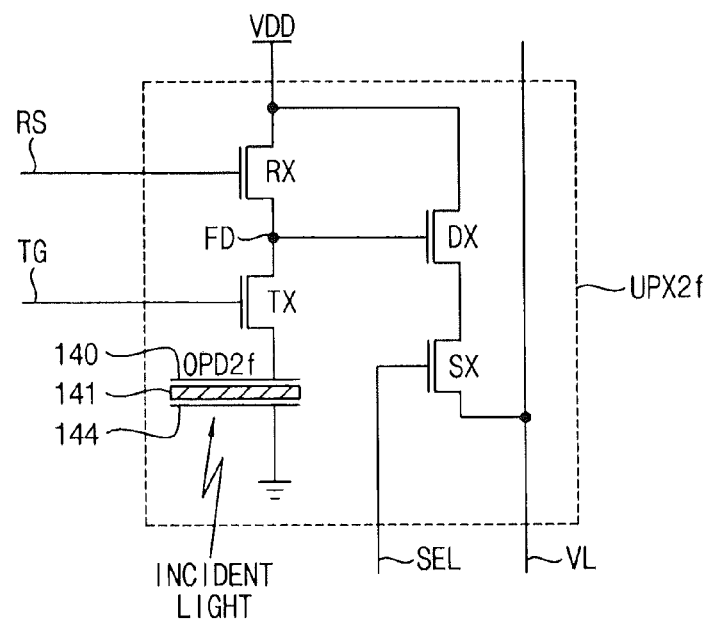
FIG. 14 is a circuit diagram illustrating the organic photoelectric conversion pixel circuit in the optical black region of the organic image sensor of FIG. 13.

FIG. 13 is a sectional view illustrating an organic image sensor according to some embodiments. FIG. 14 is a circuit diagram illustrating the organic photoelectric conversion pixel circuit in the optical black region of the organic image sensor of FIG. 13.

Referring to FIGS. 13 and 14, each organic photoelectric conversion element in the active region AR may have a stacked structure including a pixel electrode 140, an organic photoelectric conversion layer 142 and an opposite electrode 144. However, an organic photoelectric conversion element OPD2f of an organic photoelectric conversion pixel circuit UPX2f, a black pixel circuit, in the optical black region OBR may not include the organic photoelectric conversion layer 142. Rather, the pixel electrode 140 may be covered with an insulation layer 141, which does not generate photo-charges responding to the incident light. Since the organic photoelectric conversion layer of the black pixel circuit is absent, even if light is incident into the organic image sensor, no photo-charges may be generated in the organic photoelectric conversion element OPD2f.

To form the organic photoelectric conversion pixel circuit of FIGS. 13 and 14, the insulation layer 141 may be removed from the active region AR when the insulation layer 141 in the optical black region OBR is patterned. After forming the insulation layer 141, the organic photoelectric conversion layer 142 may be formed and patterned to form the organic photoelectric conversion layer 142a in the active region AR. The organic photoelectric conversion layer 142 may be removed from the optical black region OBR.

The organic photoelectric conversion elements of the optical black region according to some embodiments may include at most two of the pixel electrode, the organic photoelectric conversion layer, and the opposite electrode. The organic photoelectric conversion elements of the optical black region according to some embodiments may include only one of the pixel electrode, the organic photoelectric conversion layer, and the opposite electrode.

The organic photoelectric conversion elements and organic image sensors according to some embodiments may be applicable to digital still cameras, endoscopes equipped with imaging devices, and cellular phones, and imaging devices such as surveillance cameras and cameras embedded in vehicles.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An organic image sensor, comprising:
   a semiconductor substrate including an active region and an optical black region;
   a first organic photoelectric conversion pixel circuit on the active region configured to measure photo-charges corresponding to incident light, the first organic photoelectric conversion pixel circuit comprising a first organic photoelectric conversion element configured to generate charges responding to the incident light; and
   a second organic photoelectric conversion pixel circuit on the optical black region configured to measure black levels, the second organic photoelectric conversion pixel circuit comprising a second organic photoelectric conversion element configured to generate charges irrespective of the incident light, wherein the second organic photoelectric conversion element comprises:
   a first pixel electrode on the optical black region;
   a first opposite electrode on the first pixel electrode;
   a first organic photoelectric conversion layer between the first pixel electrode and the first opposite electrode; and
   a light blocking layer on the first opposite electrode to block the incident light.

2. The organic image sensor of claim 1, wherein the light blocking layer exposes the first organic photoelectric conversion element and the first organic photoelectric conversion element comprises:
   a second pixel electrode on the active region;
   a second opposite electrode on the second pixel electrode; and
   a second organic photoelectric conversion layer between the second pixel electrode and the second opposite electrode.

3. The organic image sensor of claim 1, wherein the second organic photoelectric conversion element further comprises:
   a microlens on the light blocking layer; and
   a color filter between the light blocking layer and the microlens.

4. The organic image sensor of claim 1, wherein the optical black region surrounds the active region.

5. An organic image sensor, comprising:
   a substrate including an active region and an optical black region;
   a first organic photoelectric conversion pixel circuit on the active region, comprising:
   a first organic photoelectric conversion element configured to generate charges responding to incident light; and
   a first readout circuit configured to receive a first input signal comprising the charges generated in the first organic photoelectric conversion element, wherein the first organic photoelectric conversion element is on the first readout circuit; and
   a second organic photoelectric conversion pixel circuit on the optical black region, comprising:
   a second organic photoelectric conversion element; and
   a second readout circuit configured to receive a second input signal generated irrespective of the incident light, wherein the second organic photoelectric conversion element is on the second readout circuit; and
   an insulating layer between the first organic photoelectric conversion element and the first readout circuit and between the second organic photoelectric conversion element and the second readout circuit.

6. The organic image sensor of claim 5, wherein the first organic photoelectric conversion element is electrically connected to the first readout circuit and the second organic photoelectric conversion element is electrically isolated from the second readout circuit.

7. The organic image sensor of claim 6, wherein a portion of the insulating layer between the second organic photoelectric conversion element and the second readout circuit electrically isolates the second organic photoelectric conversion element from the second readout circuit.

8. The organic image sensor of claim 7, wherein the first organic photoelectric conversion pixel circuit further comprises a first via directly contacting the first organic photoelectric conversion element and extending between the first organic photoelectric conversion element and the first readout circuit, and wherein a second via directly contacting the second organic photoelectric conversion element and extending between the second organic photoelectric conversion element and the second readout circuit is absent.

9. The organic image sensor of claim 5, wherein the second organic photoelectric conversion pixel circuit further comprises a first bias circuit configured to supply a first bias voltage and a portion of the insulating layer between the second organic photoelectric conversion element and the first bias circuit electrically isolates the second organic photoelectric conversion element from the first bias circuit.

10. The organic image sensor of claim 9, wherein the first organic photoelectric conversion pixel circuit further comprises a second bias circuit configured to supply a second bias voltage and a third via directly contacting the first organic photoelectric conversion element and extending between the first organic photoelectric conversion element and the second bias circuit, and wherein a fourth via directly contacting the second organic photoelectric conversion element and extending between the second organic photoelectric conversion element and the first bias circuit is absent.

11. The organic image sensor of claim 5, wherein the first organic photoelectric conversion element comprises:
a first pixel electrode on the active region;
a first opposite electrode on the first pixel electrode; and
a first organic photoelectric conversion layer between the first pixel electrode and the first opposite electrode,
and wherein the second organic photoelectric conversion element comprises at most two of a second pixel electrode on the optical black region, a second opposite electrode on the second pixel electrode and a second organic photoelectric conversion layer between the second pixel electrode and the second opposite electrode.

12. The organic image sensor of claim 11, wherein the second opposite electrode is absent.

13. The organic image sensor of claim 11, wherein the second pixel electrode is absent.

14. The organic image sensor of claim 11, wherein the second organic photoelectric conversion layer is absent and the second organic photoelectric conversion element further comprises an intervening insulation layer between the second pixel electrode and the second opposite electrode.

15. An image sensor, comprising:
a substrate including an active region and an optical black region;
a first photoelectric conversion pixel circuit on the active region comprising:
a first readout circuit configured to generate a first image signal corresponding to incident light;
a first photoelectric conversion element on the first readout circuit, the first photoelectric conversion element comprising a first pixel electrode, a first opposite electrode on the first pixel electrode and a first organic photoelectric conversion layer between the first pixel electrode and the first opposite electrode; and
a first connecting circuit between the first readout circuit and the first photoelectric conversion element, the first connecting circuit electrically connecting the first photoelectric conversion element and the first readout circuit; and
a second photoelectric conversion pixel circuit on the optical black region comprising:
a second readout circuit configured to generate a second image signal corresponding to reduced influence of the incident light on the second photoelectric conversion pixel circuit;
a second photoelectric conversion element on the second readout circuit; and
a second connecting circuit between the second readout circuit and the second photoelectric conversion element; and
an insulation layer between the first readout circuit and the first photoelectric conversion element and between the second readout circuit and the second photoelectric conversion element.

16. The image sensor of claim 15, further comprising a light blocking layer covering the second photoelectric conversion element to block the incident light while exposing the first photoelectric conversion element.

17. The image sensor of claim 15, wherein a portion of the insulation layer is disposed between the second photoelectric conversion element and the second connecting circuit for electrical isolation therebetween.

18. The image sensor of claim 15, wherein the second photoelectric conversion pixel circuit further comprises a bias circuit configured to supply a bias voltage and a portion of the insulation layer is disposed between the second photoelectric conversion element and the bias circuit for electrical isolation therebetween.

19. The image sensor of claim 15, wherein the second photoelectric conversion element comprises at most two of a second pixel electrode, a second opposite electrode on the second pixel electrode and a second organic photoelectric conversion layer between the second pixel electrode and the second opposite electrode.

* * * * *